(12) United States Patent
Stacey et al.

(10) Patent No.: US 12,214,579 B2
(45) Date of Patent: Feb. 4, 2025

(54) DRY FILM LAMINATION WITH DYNAMIC FEEDBACK CONTROL

(71) Applicant: Intel Corporation, Santa Clara, CA (US)

(72) Inventors: Joshua Stacey, Chandler, AZ (US); Yosef Kornbluth, Phoenix, AZ (US); Whitney Bryks, Tempe, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 156 days.

(21) Appl. No.: 17/949,276

(22) Filed: Sep. 21, 2022

(65) Prior Publication Data

US 2024/0092074 A1 Mar. 21, 2024

(51) Int. Cl.
| | | |
|---|---|---|
| B32B 41/00 | (2006.01) | |
| B32B 37/06 | (2006.01) | |
| B32B 37/08 | (2006.01) | |
| B32B 37/10 | (2006.01) | |
| H01L 21/48 | (2006.01) | |

(52) U.S. Cl.
CPC .............. *B32B 41/00* (2013.01); *B32B 37/06* (2013.01); *B32B 37/08* (2013.01); *B32B 37/10* (2013.01); *H01L 21/4846* (2013.01); *B32B 2309/022* (2013.01); *B32B 2309/105* (2013.01); *B32B 2309/12* (2013.01); *B32B 2309/72* (2013.01); *B32B 2457/00* (2013.01)

(58) Field of Classification Search
CPC ......... B32B 41/00; B32B 37/06; B32B 37/08; B32B 37/10; B32B 2309/022; B32B 2309/105; B32B 2309/12; B32B 2309/72; B32B 2457/00; H01L 21/4846
USPC ........... 156/60, 64, 350, 351, 378, 379, 580, 156/583.1
See application file for complete search history.

(56) References Cited

U.S. PATENT DOCUMENTS

| | | | | |
|---|---|---|---|---|
| 2012/0247664 | A1* | 10/2012 | Kobayashi | .............. H01L 24/75 156/308.2 |
| 2014/0150952 | A1* | 6/2014 | Sung | .................... G02F 1/13338 156/308.2 |
| 2020/0298548 | A1* | 9/2020 | Hancock | ................. B32B 37/10 |

* cited by examiner

*Primary Examiner* — Michael N Orlando
*Assistant Examiner* — Joshel Rivera
(74) *Attorney, Agent, or Firm* — VIERING, JENTSCHURA & PARTNER mbB

(57) ABSTRACT

The present disclosure is directed to a position-controlled lamination tool or press that includes an array or plurality of pressure sensors and an array or plurality of heating/cooling elements or components, which may be coupled together, for preventing or reducing laminating film or material bleed out and improving thickness variation performance. The pressure sensors may provide a controller, which is coupled to the lamination tool, with real-time feedback on any thickness variations across a substrate panel and the controller may adjust the temperature output of the heating and cooling elements to locally modify the viscosity of the laminating material in one or more regions of the substrate panel to either decrease or increase the flowability of the laminating material.

19 Claims, 6 Drawing Sheets

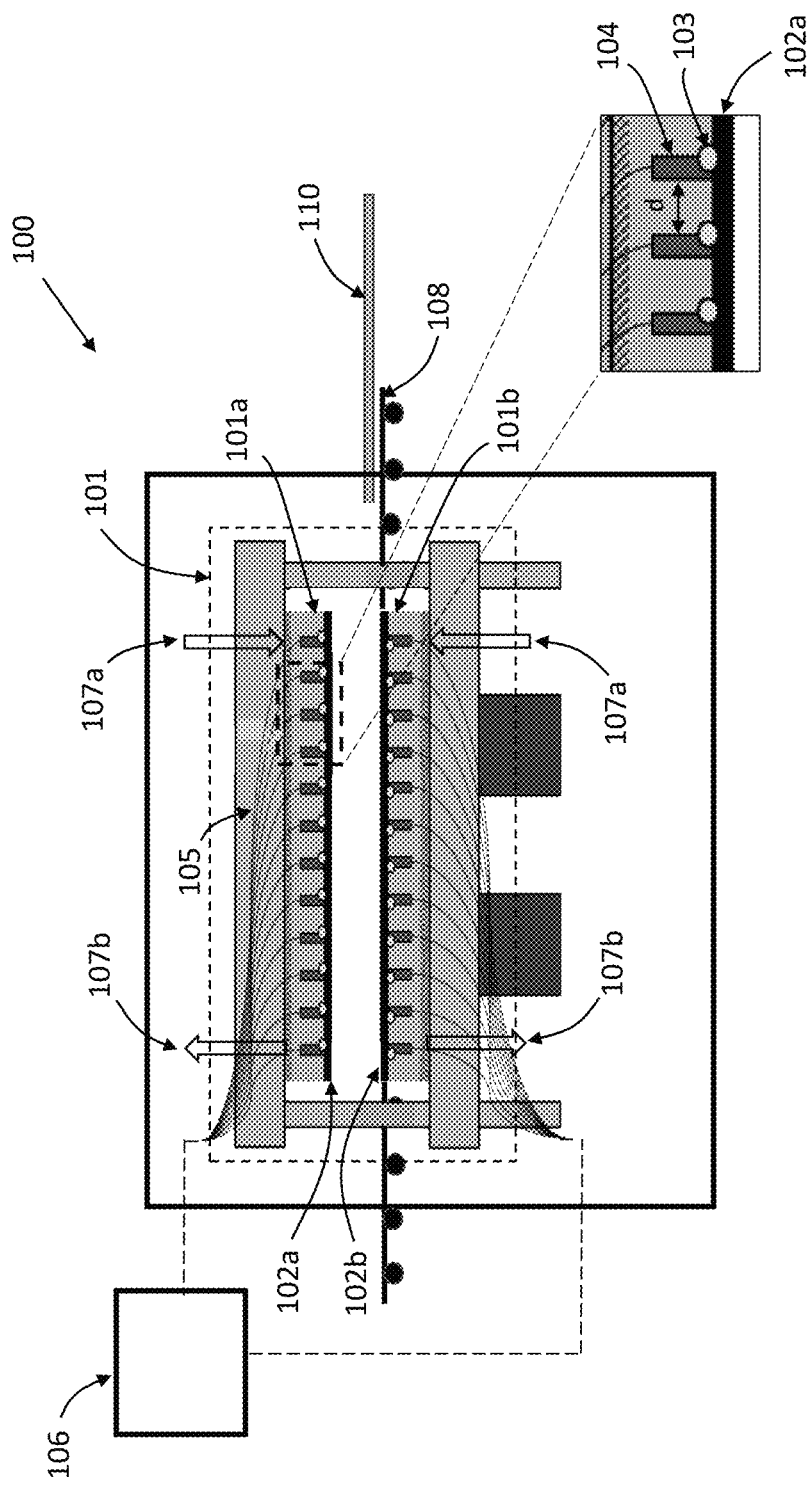

DRY FILM LAMINATION WITH DYNAMIC FEEDBACK CONTROL

BACKGROUND

In integrated circuit fabrication, the need to minimize costs and improve performance and yields are constant challenges. The integrated circuit (IC) substrate or IC package substrate is an increasingly important part of an IC package and there is increased focus on its fabrication. In addition to being a support platform and protecting the bare IC or semiconductor die, the package substrate also facilitates connections between the IC and a printed circuit board's network of traces. The substrates consist of several layers, which may or may not include a middle supporting core, that will typically contain a network of drill holes, vias, and conductor pads that may have a density that exceeds the density of conventional printed circuit boards. A package substrate may have a significant influence on an IC's performance. Moreover, the use of 2.5D and 3D packaging technology has further increased the complexity of designing and fabricating package substrates. The fabrication of package substrates is typically carried out on lamination tools or equipment.

Lamination is a type of polymeric resin-based thin film application process that, for example, presses or laminates a layer or sheet of a dielectric material (e.g., a thermoset material) on top of a patterned metal layer to form laminated substrate packages. Currently, dry film lamination processes are highly susceptible to excessive bleed out (i.e., material flow beyond the initial dimensions of the laminated substrate). Removing the bleed out via laser ablation or wet/dry etching adds additional manufacturing process steps, which increase the cost and decrease the overall cycle time of a product. In addition, a lamination process may result in localized thickness variations driven by underlying pattern design and other incoming variations. Both of these unwanted results may have negative consequences that impact downstream and end-of-line processes (e.g., optimization for overall package thickness variation).

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIGS. 1 and 1A show exemplary representations of a lamination tool according to an aspect of the present disclosure;

DETAILED DESCRIPTION

Figure 2A:
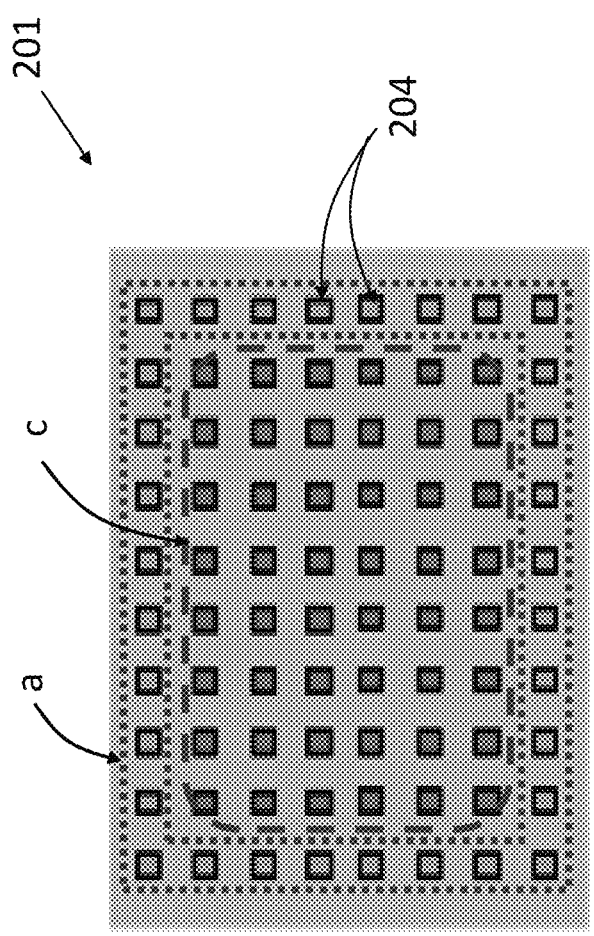
FIGS. 2A, 2B, and 2C show exemplary temperature profile set points according to another aspect of the present disclosure.

The following detailed description refers to the accompanying drawings that show, by way of illustration, specific details, and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure is directed to position-controlled lamination tools or presses, including servo-driven lamination tools, that have an added plurality of heating and cooling elements; in particular, an array or plurality of thermoelectric heating/cooling (TE) elements or components, which may be coupled together with an array or plurality of embedded pressure sensors, for preventing or reducing laminating film or material bleed out and improving thickness variation performance. The embedded pressure sensors may be connected to a controller, which is coupled to the lamination tool, to provide real-time feedback on any thickness variations across a substrate panel and the controller may automatically adjust the temperature output of the TE elements to locally modify the laminating material's viscosity in one or more regions of the substrate panel to either decrease or increase the flowability of the laminating material.

In an aspect, the present disclosure is directed to a lamination tool that includes a press unit having a heating block with a pressing surface, which may be provided with global ohmic heating, and an additional plurality of thermoelectric heating and cooling elements positioned proximally to and distributed throughout the pressing surface, which may provide specific localized heating. In an aspect, the heating block is coupled to a controller unit that is configured to individually regulate the heat output of each of the plurality of thermoelectric heating and cooling elements.

In another aspect, the present disclosure is directed to a method that provides for an item for lamination to be placed into a press area of a lamination tool and positioning a laminating film over a lamination area for the item. Thereafter, applying pressure on the laminating film and applying heat to the laminating film to reduce a viscosity of the laminating film, wherein the heat and the pressure bond the laminating film to the item to form a laminated item and adjusting the applying of heat or applying cooling according to temperature profile set points and/or pressure set points, as measured by pressure sensors to selectively adjust the viscosity of the laminating film to improve the uniformity of thickness.

The present lamination tool or equipment may have improved overall process performance and capability that better prevents bleed out and compensates for any incoming thickness variations in the item to be laminated as well as reducing the outgoing thickness variations. The technical advantages of the present disclosure may include, but are not limited to:

(i) providing a lamination tool having a heating surface that may be controlled independently in different regions of the surface;
(ii) allowing for feedback control using individual heating and cooling elements and pressure sensors;
(iii) preventing or reducing laminating film bleed out (i.e., eliminating or reducing the number of excess removal steps);

(iv) improving a package substrate's thickness variation performance and core thickness variation performance (i.e., flatness and/or other set thickness profiles); and (v) providing increased lamination throughput from its current state via improved quality.

To more readily understand and put into practical effect the present disclosure using a laminating tool and the methods for building a package substrate, particular aspects will now be described by way of examples provided in the drawings that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

FIG. 1 shows an exemplary representation of a lamination tool 100 according to an aspect of the present disclosure. The lamination tool 100 includes a press unit 101 that applies pressure and heat to an item to be laminated 110. The press unit 101 may have an upper heating block 101a with an upper pressing surface 102a and an opposing lower heating block 101b with an opposing lower pressing surface 102b. It is within the scope of the present disclosure to have the press unit 101 configured with either one or both of pressing surfaces 102a and 102b being movable with respect to the other surface (i.e., one surface may be stationary). In an aspect, the press unit 101 may operate at a pressure in the range of 0.3 to 3.0 MPa; in particular, a range of 0.7 to 1.5 MPa. In another aspect, the item to be laminated 110 may be positioned in the press unit 101 by a handler 108, such as rollers, a conveyor belt, transfer film, a robot arm, or other conveyance mechanisms.

In another aspect, the upper and lower heating blocks 101a and 101b may have, in addition to a large ohmic heater, a plurality or array of pressure sensors 103 and a plurality or array of heater/cooler elements 104 (e.g., thermoelectric heating and cooling elements or TE elements) configured inside or embedded in the heater blocks 101a and 101b (i.e., directly behind the pressing surfaces). In a further aspect, the pressure sensors 103 may be embedded in a pressing surface (not shown) for improved pressure detection sensitivity. In yet another aspect, the pressing surfaces 102a and 102b may be made of thermoconductive rigid plates, e.g., stainless steel or ceramic plates, that may have a typical thickness of a few millimeters, e.g., approximately two (2) mm. It should be understood that the present disclosure of positioning pressure sensors and TE elements at the pressing surfaces may be applied to one-sided press units as well.

In a further aspect, as part of a cooling system, process chilling water may be fed through the upper and lower heating blocks 101a and 101b via an inlet 107a and an outlet 107b to remove heat from the press unit 101 and to aid in cooling a hot side of the TE elements 104 when in a "cooling mode" to increase the viscosity of a region of a build-up film.

In FIG. 1A, according to the present disclosure, for the pressing surface 102a made of a stainless steel plate, the TE elements 104 may be separated by at least a distance "d", which may be approximately five (5) cm apart, based on the thermal diffusivity of stainless steel. It is understood that variations in the thickness of a stainless steel plate, or the use of other materials (e.g., ceramics) may increase or decrease this distance "d". It is understood that the distance "d" may be patterned into an array of TE elements that are positioned on a pressing surface, and the final spacings may be governed by mechanical, spacing, and other design constraints.

In an aspect, a controller unit 106 may be coupled to the plurality of TE element 104 and the plurality of sensors 103. The controller unit 106 is configured to control/regulate an output temperature for each of the plurality of TE elements in the upper and lower heating blocks 101a and 101b, with the control of the upper and lower heating blocks 101a and 101b being independent of the other. The controller unit 106 may be integrated with the lamination tool 100, as a built-in CPU or computer, or be part of a computing network or server system. In another aspect, the controller unit 106 may have access to data associated with "temperature profile set points" that provide temperature settings, as well as pressure set points, to regulate the output temperature for individual or groups of TE elements. For example, a lamination area for an item may have temperature and pressure settings that are non-uniform across a pressing surface, if desired, according to temperature and pressure profile set points that may be assigned to a particular laminating film. The controller unit 106 may automatically set the temperatures of the TE elements 104, based on the temperature profile set points, which may include accompanying pressure set points, for a specific lamination step in a standard operating procedure or as specified by an operator/engineer.

Figure 2B:
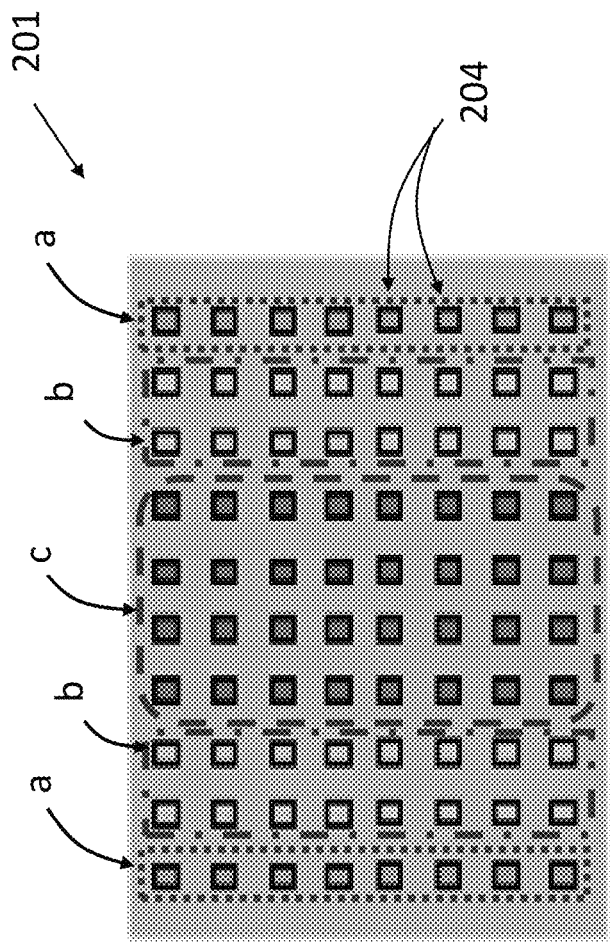
Figure 2C:
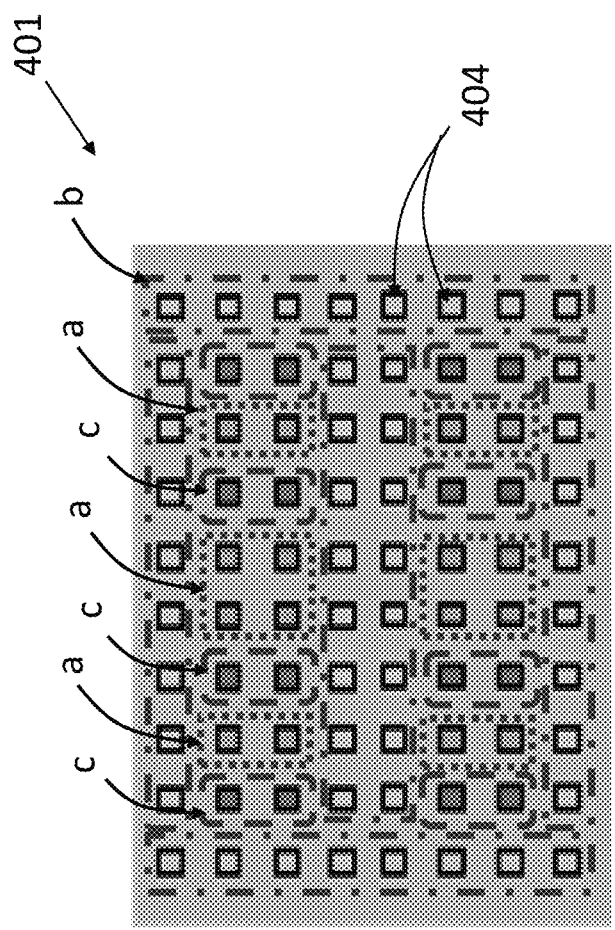

FIGS. 2A, 2B, and 2C show exemplary temperature profile set points for controlling the temperature profile across the pressing surfaces/plates to achieve specific viscosities in certain regions of a panel according to another aspect of the present disclosure. The temperature profile set points may be used to modify an initial heating temperature for a pressing surface of a press unit or as a starting point for regulating the temperature at the pressing surface, with adjustments made to certain heating and cooling elements during a lamination step. In an aspect, temperature profile set points may be selected to "compensate" for variations in thickness from a prior build-up process step, as well as variations that may occur in the next build-up process step, with the goal of obtaining a uniform thickness in the end product.

In FIG. 2A, a layout view of a heating block 201 with a plurality of thermoelectric heating and cooling elements 204 (TE elements) is shown. In this aspect, a group of TE elements 204, designated as "a", may be positioned along the periphery of the heating block 201 and have a low-temperature range setting that causes bonding for lamination but limits or prevents bleed out by a laminating film (not shown) due to a higher viscosity. In addition, a group of TE elements 204, designated as "c", may be positioned in the interior portion of the heating block 201 and have a high-temperature range setting that causes bonding lamination and a lower viscosity (i.e., greater movement) for the laminating film. The corresponding interior or center portion of a panel contains the individual units where the laminating material may be allowed to more easily flow to fill in any spaces around an underlying copper pattern topography and produce the flattest possible surface on top of the pattern. Hence, the need for a different temperature setting than at the periphery.

In an aspect, it should be understood that there may be several temperature profile set points with different groupings of TE elements that may provide bleed out control/prevention, which may be associated with different types and dimensions of laminating films. Such temperature profile set points providing bleed out control/prevention may be determined based on collected data or determined from data available by vendors for build-up films.

In FIG. 2B, another layout view of the heating block 201 with a plurality of TE elements 204 is shown. In this aspect, groups of TE elements 204, designated as "a" may have a low-temperature range setting, as "b" may have a medium temperature range setting, and as "c" may have a high-temperature range setting for providing panel level control when using the heating block 201. In an aspect, it should be understood that there may be several temperature profile set points with different groupings of TE elements that may provide panel-level control, which may be associated with the underlying features or devices of a panel or other items to be laminated, or compensate for the unmodified behaviors of a lamination tool. Such temperature profile set points providing panel level control may be determined based on collected data or determined from data available by vendors for build-up films.

In FIG. 2C, yet another layout view of the heating block 201 with a plurality of TE elements 204 is shown. In this aspect, groups of TE elements designated as "a" may have a low-temperature range setting, as "b" may have a medium temperature range setting, and as "c" may have a high-temperature range setting for providing highly localized and/or unit level control when using the heating block 201. In an aspect, it should be understood that the temperature profile set points for highly localized and unit-level control may regulate TE elements based on the underlying features or devices of a panel or other items to be laminated. Such temperature profile set points providing highly localized and unit level control may be determined based on collected data or determined from data available by vendors for build-up films.

Figure 3:
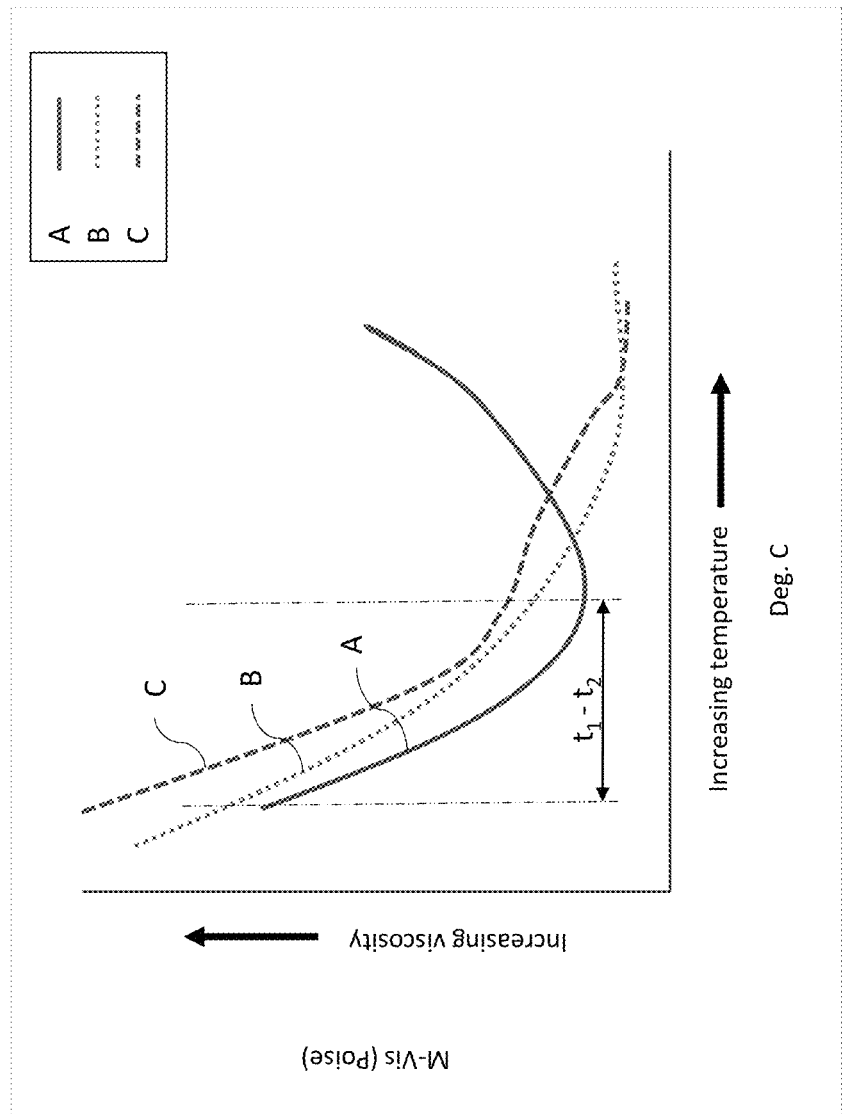
FIG. 3 shows exemplary characteristics of laminating films with respect to viscosity and temperature according to another aspect of the present disclosure.

FIG. 3 shows exemplary characteristics of laminating films (e.g., build-up films) with respect to increasing viscosity and temperature according to another aspect of the present disclosure. The build-up films may be mixtures of silica nanoparticles and binders that may be cured into a solid and are typically used as dielectrics. The build-up films are dispensed from large rolls, which are unrolled bit-by-bit at the time of use. Other types of laminating films may include photoresists, anti-static films, or other layer materials that may be pressed into a laminated structure.

In an aspect, it is typical for viscosity to decrease with increasing temperature, as shown in FIG. 3 for build-up films A, B, and C. The present disclosure may benefit from using build-up films that have a higher degree of viscosity change within a narrow temperature range; for example, a temperature range of $t_1$ to $t_2$° C. as shown in FIG. 3. It is within the scope of the present disclosure to select the various build-up films based on their viscosity and other properties to provide bleed out control, panel level control, and highly localized/unit level control. For example, the use of high temperatures may target build-up films with the lowest or lower viscosities, while the use of lower temperatures may target build-up films with higher viscosities. A higher viscosity laminating film may result in thicker layers, while a lower viscosity laminating film may result in smoother and thinner layers. Additionally, a lower viscosity may prevent the formation of "voids" or small regions under the laminated item's surface where the build-up film fails to reach, and may allow for shorter laminating process times.

In an aspect, a lamination process may use the present lamination tool to obtain real-time feedback from a plurality of pressure sensors at a pressing surface to adjust the temperature output of one or more TE elements to that provided by a temperature profile set point to produce a more desirable viscosity, i.e., higher temperature/lower viscosity for areas with greater pressure readings and reducing temperature/increasing viscosity for areas with lower pressure readings. The response time for adjusting the temperature for a TE element may be fast as thirty (30) seconds. An end-point for the lamination process may be triggered or reached based on observed improvements or achievement of pressure uniformity or other desired pressure profile across the pressing surfaces. After a lamination step is completed, a variety of through-hole vias, traces and other interconnects may be formed. The lamination process may be repeated as many times as needed to complete the lamination of a panel or other items to be laminated, including a plurality of pre-diced substrate cores and various intermediates and pre-finished forms of a package substrate.

Figure 4:
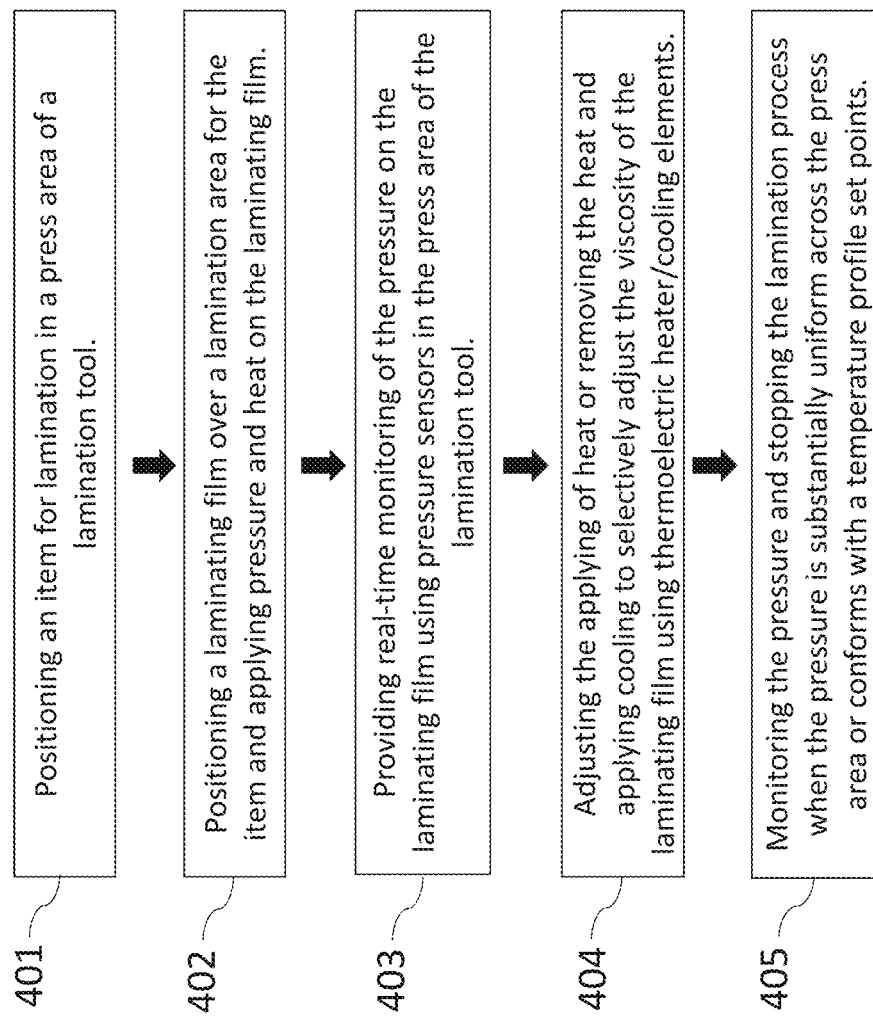
FIG. 4 shows a simplified flow diagram for an exemplary method according to a further aspect of the present disclosure.

FIG. 4 shows a simplified flow diagram for a further exemplary lamination method according to a further aspect of the present disclosure. In an aspect, the present method may be able to provide a lamination process step using the operations below.

The operation 401 may be directed to positioning an item for lamination in a press area of a lamination tool.

The operation 402 may be directed to positioning a laminating film over a lamination area for the item and applying pressure and heat on the laminating film to bond it with the item.

The operation 403 may be directed to providing real-time monitoring of the pressure on the laminating film using pressure sensors in the press area of the lamination tool.

The operation 404 may be directed to adjusting the applying of heat or removing the heat and applying cooling to selectively adjust the viscosity of the laminating film using thermoelectric heater/cooling elements.

The operation 405 may be directed to monitoring the pressure and stopping the lamination process when the pressure is substantially uniform across the press area or conforms with a temperature profile set points. The total time to complete the operating steps for a typical lamination process may be approximately five minutes, with an individual pressing step lasting approximately 15 to 120 seconds.

It will be understood that any specific property described herein for a particular aspect of the present lamination tool and the method may also generally hold for any of the other aspects thereof described herein. It will also be understood that any specific property described herein for a specific method may generally hold for any of the other methods described herein. Furthermore, it will be understood that for any system, component or method described herein, not necessarily all the components or operations described will be enclosed in the system, component, or method, but only some (but not all) components or operations may be enclosed.

To more readily understand and put into practical effect the present lamination tools and methods, they will now be described by way of examples. For the sake of brevity, duplicate descriptions of features and properties may be omitted.

EXAMPLES

Example 1 provides for a lamination tool including a press unit having a heating block, the heating block including a pressing surface and a plurality of heating and cooling elements positioned proximally to and distributed throughout the pressing surface, and a controller unit configured to regulate an output temperature of each of the plurality of heating and cooling elements.

Example 2 may include the lamination tool of example 1 and/or any other example disclosed herein, for which the press unit further includes a plurality of pressure sensors that are paired with and positioned proximal to the plurality of heating and cooling elements, the plurality of pressure sensors being coupled to the controller unit, for which the plurality of pressure sensors provide feedback to the controller for regulating the output temperature from of selected heating and cooling elements.

Example 3 may include the lamination tool of example 2 and/or any other example disclosed herein, for which the controller unit is provided with a plurality of temperature profile set points to regulate each of the plurality of heating and cooling elements based on their locations on the pressing surface, wherein the temperature profile set points comprises pressure set points.

Example 4 may include the lamination tool of example 3 and/or any other example disclosed herein, for which the temperature profile set points regulate the output temperature of the heating and cooling elements at the pressing surface to control a viscosity of a laminating film placed on an item for lamination.

Example 5 may include the lamination tool of example 1 and/or any other example disclosed herein, for which the press unit further includes an opposing heating block, the opposing heating block includes a plurality of opposing heating and cooling elements positioned proximally to an opposing pressing surface and distributed throughout the opposing pressing surface.

Example 6 may include the lamination tool of example 1 and/or any other example disclosed herein, for which the pressing surface is a thermoconductive rigid plate.

Example 7 may include the lamination tool of example 1 and/or any other example disclosed herein, for which the heating block further includes a cooling system for providing a coolant to the pressing surface.

Example 8 provides a method including providing an item for lamination and positioning the item in a press area of a lamination tool, positioning a laminating film over a lamination area for the item, applying heat and applying pressure on the laminating film to reduce a viscosity of the laminating film, for which the heat and the pressure bond the laminating film to the item to form a laminated item, and adjusting the applying of heat or removing the heat and applying cooling according to temperature profile set points to selectively adjust the viscosity of the laminating film to control a thickness profile of the laminated item.

Example 9 may include the method of example 8 and/or any other example disclosed herein, for which the applying of pressure and the applying of heat are regulated using a controller coupled to the lamination tool.

Example 10 may include the method of example 9 and/or any other example disclosed herein, for which the applying of pressure and heat are enabled by a press unit of the lamination tool, the press unit having a heating block including a pressing surface and a plurality of heating and cooling elements, and a plurality of pressure sensors that are positioned proximally to and distributed throughout the pressing surface, and for which the plurality of heating and cooling elements and the plurality of pressure sensors are coupled to the controller.

Example 11 may include the method of example 10 and/or any other example disclosed herein, further includes providing the controller unit with a plurality of temperature profile set points to regulate each of the plurality of heating and cooling elements based on their locations on the pressing surface, wherein the temperature profile set points comprises pressure set points.

Example 12 may include the method of example 11 and/or any other example disclosed herein, further includes the plurality of pressure sensors providing feedback to the controller, and monitoring the applying of pressure to adjust the applying of heat or remove the heat and applying cooling by selected heating and cooling elements based on their locations on the pressing surface and the feedback.

Example 13 may include the method of example 12 and/or any other example disclosed herein, for which the temperature profile set points regulate each of the plurality of heating and cooling elements to selectively adjust the viscosity of the laminating film to provide the laminated item with predefined thicknesses at different locations of the laminated item.

Example 14 may include the method of example 12 and/or any other example disclosed herein, further includes the laminating film having a film boundary and the lamination area having an area boundary, for which the temperature profile set points regulate each of the plurality of heating and cooling elements to selectively adjust the viscosity of the laminating film to form the laminated item with the film boundary being substantially coextensive with the area boundary.

Example 15 may include the method of example 8 and/or any other example disclosed herein, for which the lamination area for the item further includes a top area and a bottom area for the item for lamination, and a first laminating film is positioned over the top area and a second laminating film is positioned over the bottom area.

Example 16 may include the method of example 8 and/or any other example disclosed herein, further includes positioning additional lamination films on the lamination area and having additional temperature profile set points for each additional lamination film.

Example 17 may include the method of example 8 and/or any other example disclosed herein, further includes introducing a coolant into the heating block to cool the laminated item and separate the laminated item from the press unit.

Example 18 may include the method of example 8 and/or any other example disclosed herein, for which the item for lamination includes a panel, a plurality of pre-diced substrate cores, and various intermediates and pre-finished forms of package substrates.

Example 19 provides for a lamination tool including a press unit having upper and lower heating blocks, the upper and lower heating blocks, respectively, comprise a pressing surface, a plurality of thermoelectric heating and cooling elements positioned proximally to and distributed throughout the pressing surface, and a plurality of pressure sensors that are paired with and positioned proximal to the plurality of thermoelectric heating and cooling elements, for which the plurality of pressure sensors provide feedback to the controller for regulating output temperatures from the thermoelectric heating and cooling elements, and a controller unit configured to regulate the output temperature from each of the plurality of thermoelectric heating and cooling elements.

Example 20 may include the lamination tool of example 19 and/or any other example disclosed herein, further includes a cooling system for providing a coolant to the heating blocks and the plurality of thermoelectric heating and cooling elements.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The terms "and" and "or" herein may be understood to mean "and/or" as including either or both of two stated possibilities.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A lamination tool comprising:
    a press unit comprising:
        a plurality of pressure sensors; and
        a heating block, the heating block comprising a pressing surface and a plurality of heating and cooling elements positioned proximally to and distributed throughout the pressing surface, wherein the plurality of pressure sensors are embedded in the pressing surface, wherein each pressure sensor is paired with and adjacent to a corresponding one of the plurality of heating and cooling elements; and
    a controller unit configured to regulate an output temperature of each of the plurality of heating and cooling elements, wherein each pressure sensor of the plurality of pressure sensors is coupled to the controller unit and configured to provide a corresponding pressure sensor feedback to the controller unit, wherein the output temperature for each of the corresponding ones of the plurality of heating and cooling elements is based on its corresponding pressure sensor feedback.

2. The lamination tool of claim 1, wherein the controller unit is provided with a plurality of temperature profile set points to regulate each of the plurality of heating and cooling elements based on their locations on the pressing surface, wherein the temperature profile set points comprises pressure set points.

3. The lamination tool of claim 2, wherein the temperature profile set points regulate the output temperature of the plurality of heating and cooling elements at the pressing surface to control a viscosity of a laminating film placed on an item for lamination.

4. The lamination tool of claim 1, wherein the press unit further comprises an opposing heating block, the opposing heating block comprises a plurality of opposing heating and cooling elements positioned proximally to an opposing pressing surface and distributed throughout the opposing pressing surface.

5. The lamination tool of claim 1, wherein the pressing surface is a thermoconductive rigid plate.

6. The lamination tool of claim 1, wherein the heating block further comprises a cooling system for providing a coolant to the pressing surface.

7. A method comprising:
    providing an item for lamination and positioning the item in a press area of a lamination tool, the lamination tool comprising a press unit comprising a plurality of pressure sensors and a heating block, the heating block comprising a pressing surface and a plurality of heating and cooling elements positioned proximally to and distributed throughout the pressing surface, wherein the plurality of pressure sensors are embedded in the pressing surface, wherein each pressure sensor is paired with and adjacent to a corresponding one of the plurality of heating and cooling elements;
    positioning a laminating film over a lamination area for the item;
    applying heat at the plurality of heating and cooling elements and applying pressure on the laminating film to reduce a viscosity of the laminating film, wherein the heat and the pressure bond the laminating film to the item to form a laminated item;
    measuring at each pressure sensor of the plurality of pressure sensors a corresponding pressure sensor feedback; and
    adjusting the applying of heat or removing the heat and applying cooling at the corresponding ones of the plurality of heating and cooling elements, each based on its corresponding pressure sensor feedback and according to temperature profile set points to selectively adjust the viscosity of the laminating film to control a thickness profile of the laminated item.

8. The method of claim 7, wherein the applying of pressure and the applying of heat is regulated using a controller coupled to the lamination tool.

9. The method of claim 8, wherein the applying of pressure and heat are enabled by a press unit of the lamination tool, the press unit having a heating block comprising a pressing surface and a plurality of heating and cooling elements, and a plurality of pressure sensors that are positioned proximally to and distributed throughout the pressing surface, and wherein the plurality of heating and cooling elements and the plurality of pressure sensors are coupled to the controller.

10. The method of claim 9, further comprises providing a controller unit with a plurality of temperature profile set points to regulate each of the plurality of heating and cooling elements based on their locations on the pressing surface, wherein the temperature profile set points comprises pressure set points.

11. The method of claim 10, further comprises the plurality of pressure sensors providing feedback to the controller; and
    monitoring the applying of pressure to adjust the applying of heat or remove the heat and applying cooling by selected heating and cooling elements based on their locations on the pressing surface and the feedback.

12. The method of claim 11, wherein the temperature profile set points regulate each of the plurality of heating and cooling elements to selectively adjust the viscosity of the laminating film to provide the laminated item with predefined thicknesses at different locations of the laminated item.

13. The method of claim 11, further comprises the laminating film having a film boundary and the lamination area having an area boundary, wherein the temperature profile set points regulate each of the plurality of heating and cooling elements to selectively adjust the viscosity of the laminating film to form the laminated item with the film boundary being substantially coextensive with the area boundary.

14. The method of claim 7, wherein the lamination area for the item further comprises a top area and a bottom area for the item for lamination, and a first laminating film is positioned over the top area and a second laminating film is positioned over the bottom area.

15. The method of claim 7, further comprises positioning additional lamination films on the lamination area and having additional temperature profile set points for each additional lamination film.

16. The method of claim 7, further comprises introducing a coolant into the heating block to cool the laminated item and separate the laminated item from the press unit.

17. The method of claim 7, wherein the item for lamination comprises a panel, a plurality of pre-diced substrate cores, and various intermediates and pre-finished forms of package substrates.

18. A lamination tool comprising:
a press unit having upper and lower heating blocks, the upper and lower heating blocks, respectively, comprise a pressing surface, a plurality of thermoelectric heating and cooling elements positioned proximally to and distributed throughout the pressing surface, and a plurality of pressure sensors that are paired with and positioned proximal to the plurality of thermoelectric heating and cooling elements, wherein the plurality of pressure sensors are embedded in the pressing surface, wherein each pressure sensor is paired with and adjacent to a corresponding one of the plurality of heating and cooling elements; and
a controller unit configured to regulate an output temperature from each of the plurality of thermoelectric heating and cooling elements, wherein the plurality of pressure sensors provide feedback to the controller unit, wherein the output temperature of each of the corresponding ones of the plurality of heating and cooling elements is based on its corresponding pressure sensor feedback.

19. The lamination tool of claim 18, further comprises a cooling system for providing a coolant to the upper and lower heating blocks and the plurality of thermoelectric heating and cooling elements.

* * * * *